(12) United States Patent
Cao (10) Patent No.: US 7,944,309 B2
(45) Date of Patent: May 17, 2011

(54) TRANSCONDUCTANCE BIAS CIRCUIT, AMPLIFIER AND METHOD

(75) Inventor: Zhiheng Cao, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 50 days.

(21) Appl. No.: 12/406,560

(22) Filed: Mar. 18, 2009

(65) Prior Publication Data

US 2010/0237950 A1    Sep. 23, 2010

(51) Int. Cl.
*H03F 3/04* (2006.01)
(52) U.S. Cl. ..................................... 330/296
(58) Field of Classification Search .................. 330/285, 330/296; 327/538
See application file for complete search history.

(56) References Cited

U.S. PATENT DOCUMENTS

| 7,049,889 | B2 * | 5/2006 | Kalb | ............................ 330/253 |
| 7,218,179 | B2 | 5/2007 | Crawley | |
| 2002/0063590 | A1 | 5/2002 | Nanba et al. | |
| 2005/0285678 | A1 | 12/2005 | Kaviani et al. | |
| 2008/0303605 | A1 | 12/2008 | Takada et al. | |

FOREIGN PATENT DOCUMENTS

DE    19821735    6/1999

OTHER PUBLICATIONS

International Search Report and Written Opinion—PCT/US2010/027853, International Search Authority—European Patent Office—Sep. 2, 2010.

* cited by examiner

*Primary Examiner* — Steven J Mottola
(74) *Attorney, Agent, or Firm* — Ramin Mobarhan (57) ABSTRACT

Methods, circuits and apparatus for biasing an amplifier to maintain consistent operational characteristics over variations in fabrication processes and operational temperature conditions are disclosed. A bias is determined by first comparing output voltages of replica circuits of the amplifier during an offset canceling phase. The output voltages are differently driven by an offset induced by a first reference current and the offset is canceled in response to the first comparing step. The output voltages are secondly compared during a calibration phase and a calibration bias current is adjusted in response to the second comparing step. The amplifier bias is determined based on the calibration bias current. The process is periodically repeated in response to operational variations.

25 Claims, 7 Drawing Sheets

FIG. 1

(PRIOR ART)

TRANSCONDUCTANCE BIAS CIRCUIT, AMPLIFIER AND METHOD

BACKGROUND

1. Field

The present disclosure relates generally to biasing amplifier circuits, and more specifically, to biasing amplifier circuits needing constant gain over process and temperature variations for maintaining a constant transconductance (gm) therein.

2. Background

In RF/analog integrated circuits there is often a need for open-loop amplifier circuits that provide a constant gain which does not change over process and temperature variation. For example, LNAs, active filters, trans-impedance amplifiers and RF driver amplifiers all require such circuits.

Figure 1:
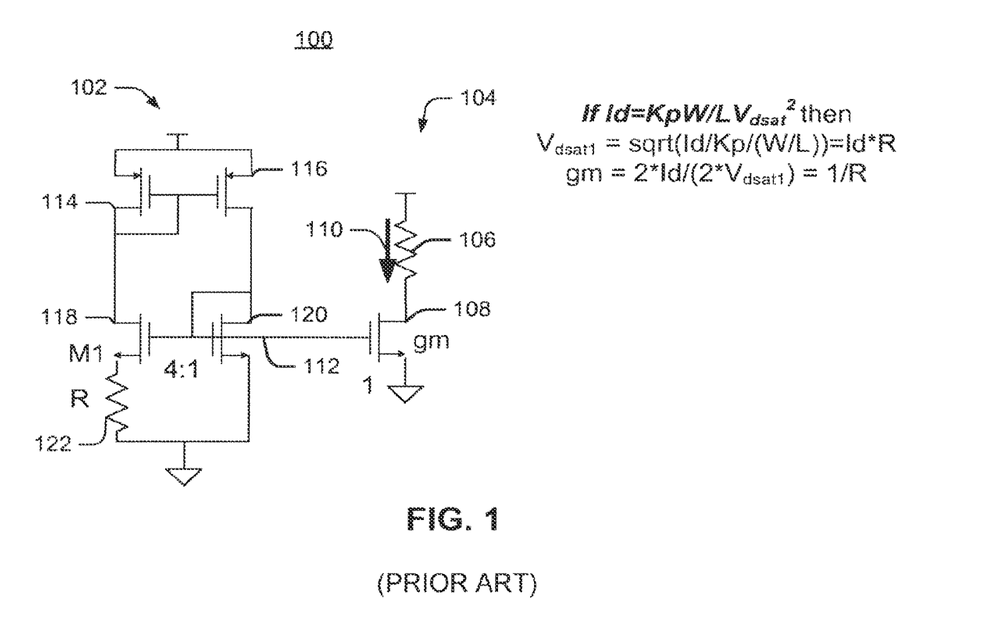
FIG. 1 is circuit illustrating a conventionally biased amplifier.

To achieve constant gain, a bias circuit is needed to bias the amplifier input transistor in order to compensate for process and temperature variations, thus allowing the transistor to maintain a constant transconductance (gm). A standard constant-gm bias circuit, as shown in FIG. 1, relies on the "square law", characteristic (i.e. $I_{ds}$ being proportional to $(V_{gs}-V_{th})^2$), and produces a constant gm only with a perfect square law characteristic. An amplifier circuit 100 includes an amplifier 104 biased according to a bias circuit 102. However, such a biasing approach is effective only with long-channel metallic oxide semiconductor (MOS) devices that utilize process technologies which follow the square law. However, in nanometer complementary MOS (CMOS) technologies in which many radio frequency (RF) and analog integrated circuits (ICs) are currently implemented, the current (I) to voltage (V) (I-V) characteristics of a MOS transistor, even with long channel length, deviates substantially from the square law characteristic.

For RF amplifiers which require transistors with a high unity current gain cutoff frequency (ft), short-channel transistors must be used whose I-V characteristics no longer follow the square law characteristic and cannot be easily modeled. Therefore, there is a need for a bias circuit that does not rely on the square-law biasing model and hence allows transistors in deep submicron/nanometer CMOS technologies to maintain constant transconductance (gm) over process and temperature variation.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

Various circuits operating at high frequencies, such as radio frequencies (RF), require calibration in order to maintain consistent operational characteristics over variations in fabrication processes and operational temperature conditions. Such circuits include low noise amplifiers (LNAs), mixers, synthesizers, resistance capacitance (RC) filters and transconductance capacitance (gm-C) filters. Since these types of electrical circuits operate in an open loop configuration, calibration of the open loop gain for such circuits is necessary due to the inability at high frequencies to use conventional feedback calibration techniques to set the gain. Gain is thus usually set by "matching" active transistor components to passive elements such as inductors, resistors and capacitors. Active components on an integrated circuit (IC) do not typically match very well to the passive components resulting in the need for a method of calibrating the gain to ensure that a circuit design is manufacturable.

To facilitate calibration, separate control circuitry, namely calibration circuitry, is used to provide calibration of the gain of these target RF circuits. Such calibration circuits typically include a "replica," or a nearly identical portion of circuitry similar to or matched to that within the target RF circuit, so that the target RF circuit may be calibrated to compensate for integrated circuit process (P) parameter variations, power supply voltage (V) variations, and temperature (T) variations, (commonly referred to as "PVT corners") as well as parasitic capacitance, transconductance (gm) and the like. Conventionally, such calibration circuits have used the "large" signal characteristics of the devices in the target RF circuit. However, such calibration circuits can suffer from inaccuracies due to poor matching of large signal parameters to "small" signal parameters. Furthermore, the small signal parameters determine the gain of the target RF circuits. Even more problematic is the fact that as process geometries get smaller and finer, the large signal models for the devices no longer match simple modeling of RF circuit transistors.

By way of an example of the problem, in a simulation example the transconductance (gm) may vary from 29 msec at −30° C. at the slow process corner to 45 msec at 110° C. at the fast process corner of an 85 nm channel length transistor biased with a standard constant-gm bias circuit using a replica 85 nm transistor. The poor performance of a conventional standard constant-gm bias circuit in a nanometer CMOS process is an often encountered problem in industry.

Figure 2:
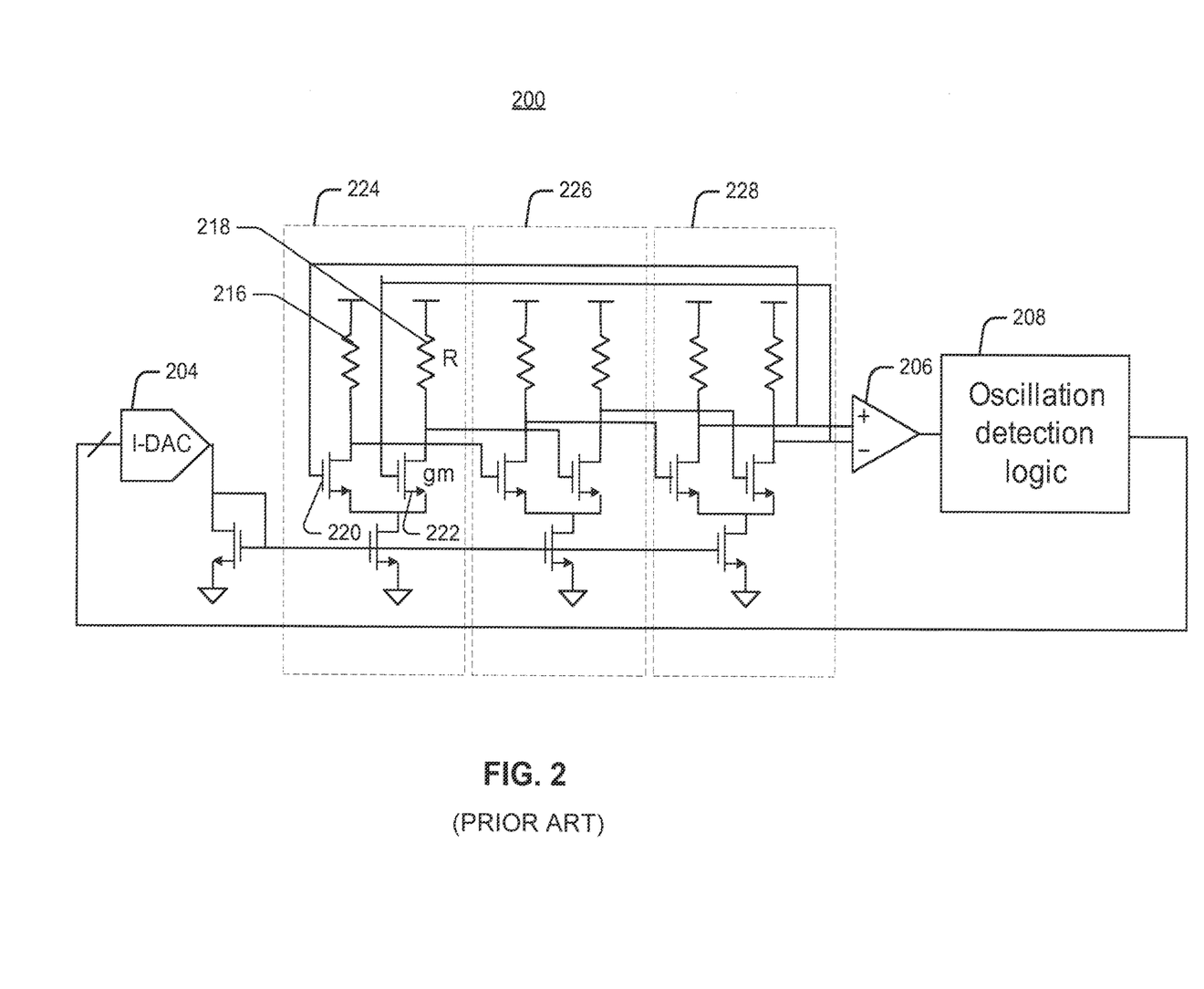
FIG. 2 is a circuit illustrating biasing circuit.

One approach for achieving a constant transconductance (gm) bias in nanometer CMOS RF circuits is disclosed in U.S. Pat. No. 7,218,179 entitled "Methods and Apparatus for Calibrating gm-Z." That disclosed approach, as illustrated in FIG.

2, uses a three-stage ring-oscillator 200, wherein each stage 224, 226, 228 is a replica of the main amplifier whose gain is attempted to be made constant. The oscillator 200 starts to oscillate when the gain of each stage 224, 226, 228 becomes larger than unity when the phase shift is 60 degrees. If each stage 224, 226, 228 is a single-pole system, then when phase=60 degrees, the gain is 6 dB less than the gain at DC, which is gm*R. Therefore the oscillation starts if gm*R>2.

A digital controller ramps-up a current digital-to-analog converter (DAC) 204 output which is used to bias each gain stage 224, 226, 228 in the oscillator 200 until gm*R reaches a value of two times unity, with digital logic 206, 208 detecting the start of oscillation. Therefore the bias current to achieve gm=2/R is obtained without relying on the square law characteristic. By running this calibration procedure every few seconds, the bias current can be made to track temperature variation during operation. Advantages of the disclosed solution in U.S. Pat. No. 7,218,179 include simple analog circuits that can easily be made to match the main amplifier, and the lack of need for analog feedback loops whose accuracy generally relies on transistor gain. Therefore, the approach disclosed in U.S. Pat. No. 7,218,179 is scalable to smaller featured CMOS processes. However, disadvantages in the disclosed solution of U.S. Pat. No. 7,218,179 exist including the ring-oscillator gain stage may not be an exact single-pole system and the possible complexity of the oscillation detection logic.

Figure 3:
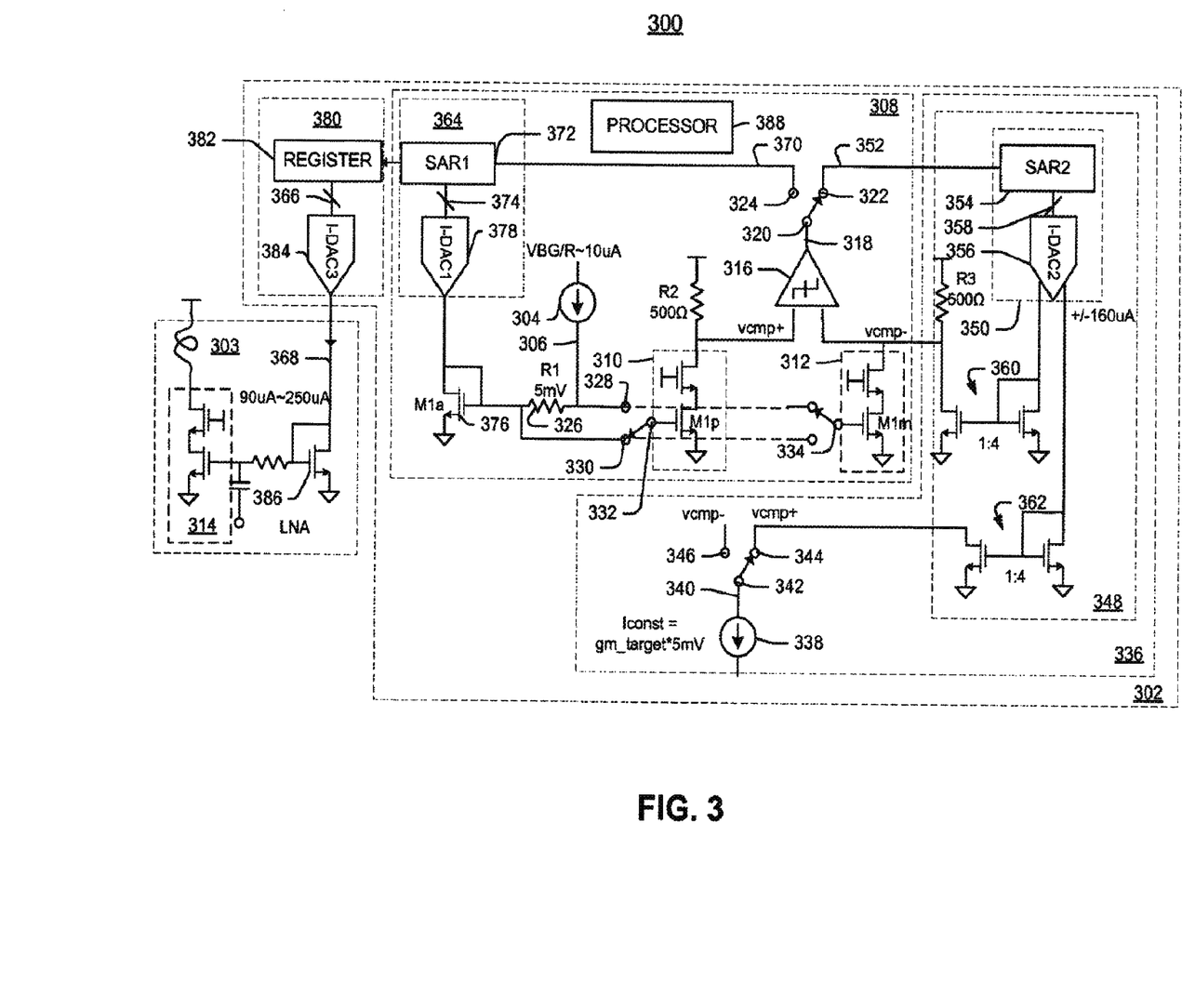
FIG. 3 illustrates a biased amplifier, in accordance with one exemplary embodiment.

FIG. 3 illustrates a biased amplifier, in accordance with one exemplary embodiment. A biased amplifier 300 includes a bias circuit 302 for configuring an amplifier circuit 303 into a biased configuration. Biasing circuit 302 of the present exemplary embodiment does not rely on the square-law biasing model and hence allows transistors in deep submicron/nanometer CMOS technologies to maintain constant transconductance (gm) over process and temperature variations. Furthermore, biasing circuit 302 of the present exemplary embodiment consumes less power and produces less noise (i.e., thermal noise and flicker noise) than conventional bias circuits. Further advantages of the biasing circuit 302 include accuracy that does not rely on transistor gain (gm/gds) which degrades as CMOS processes are scaled down to finer resolutions allowing the bias circuit 302 to be scaled to newer and future processes. Additionally, the bias circuit 302 does not require matching of all components of the biasing circuit resulting in fewer matched components and smaller silicon realization circuit area.

Bias circuit 302 generally includes a first reference current generator 304 to output a first reference current 306. First reference current generator 304 is configured as a constant current source and may be particularly configured as a bandgap reference generator. First reference current generator 304, by way of example and not limitation, is configured to source approximately 10 µA across the operational corners of the biased amplifier 300.

Bias circuit 302 further includes a bias determining circuit 308, including at least one replica circuit, configured according to the amplifier circuit 303. In FIG. 3, the bias circuit 302 includes a first replica circuit 310 and a second replica circuit 312. Each replica circuits 310, 312 replicate the arrangement of an amplifier 314 of amplifier circuit 303 in processing and other variations. Each replica circuit consists essentially of the same circuit used in amplifier 314 whose gain needs to be made constant. Furthermore, placement of replica circuits 310, 312 in close physical proximity to amplifier 314 results in substantially shared processing and operational variations thereby allowing an improved bias determination for amplifier circuit 303 by bias circuit 302.

Bias circuit 302 further includes a comparator 316 having inputs respectively coupled to node vcmp+ and node vcmp–. Node vcmp+ is coupled to first replica circuit 310 and node vcmp– is coupled to second replica circuit 312. Comparator 316 further includes an output 318 which is coupled to a switch 320 switchable to an offset canceling phase position 322 and a calibration phase position 324 further described herein below.

Bias circuit 302 further includes an offset resistor 326 (R1) coupled to the first reference current generator 304 to create a difference in potential between a voltage potential at node 328 and node 330 on opposing ends of offset resistor 326 as the first reference current 306 passes therethrough. Bias circuit 302 further includes switches 332 and 334 for alternatingly connecting the potentials at nodes 328 and 330 to respectively drive inputs of first replica circuit 310 and second replica circuit 312 in response to selection of functional phases including an offset canceling phase (phase=0) and an calibration phase (phase=1) as selected by processor 388. The switch positions illustrated in FIG. 3 are the switch positions for the offset canceling phase (i.e., phase=0).

Bias circuit 302 further includes an offset canceling circuit 336 to cancel an offset induced by the first reference current 304. Offset canceling circuit 336 includes a second reference current generator 338 for outputting a second reference current 340 to cancel the offset induced by the first reference current 306. Second reference current generator 338 is configured as a constant current source and may be particularly configured as a bandgap reference generator. Second reference current generator 338, by way of example and not limitation, is configured to source a current $I_{const}$ equal to the target transconductance (gm_target) multiplied by the voltage drop (e.g., 5 mV) across offset resistor 326 (R1).

Offset canceling circuit 336 further includes switch 342 for alternatingly connecting the second reference current 340 of second current source 338 with the potentials at nodes 344 and 346 to the respective input nodes vcmp+ and vcmp– of comparator 316. The position of switch 342 is selectable in response to selection of functional phases including an offset canceling phase (phase=0) and a calibration phase (phase=1) as selected by processor 388. As stated, the switch positions illustrated in FIG. 3 are the switch positions for the offset canceling phase (i.e., phase=0).

Offset canceling circuit 336 further includes a programmable offset canceling circuit 348 to adjust an amount of the second reference current 340 that is used to cancel the offset induced by the first reference current 306. Programmable offset canceling circuit 348 includes a programmable current source 350 responsive to offset canceling input signals 352 from comparator 316 when switch 320 is in an offset canceling phase (phase=0).

Programmable current source 350 includes a successive-approximation register (SAR2) 354 (e.g., a 6-bit current DAC (IDAC)) and a digitally driven current source 356. During the offset canceling phase (phase=0), output 318 of comparator 316 causes a count in SAR 354 to increase or decrease a resulting count signal 358 for driving a digital-to-analog converter (DAC) in digitally driven current source 356. Programmable offset canceling circuit 348 further includes current mirrors 360, 362 for programmably sinking portions of the second reference current 340 as part of the bias determination process.

In operation, digitally driven current source 356 (I-DAC2) is used to source a small amount of current to resistors R2 and R3 to add an offset. Digitally driven current source 356 (I-DAC2) is controlled by SAR 354 (SAR2), which is run in the calibration phase (phase=1) to store and compensate for the offset due to the mismatch between the positive and negative resistors (R2, R3), the offset of the replica circuits 310, 312, the offset of the comparator 316 and the mismatch error of digitally driven current source 356 (I-DAC2). The SAR2 is run such that at the end of the calibration phase (phase=1), the comparator input is very close to the trip-point of the comparator. Because of this digital offset cancellation mechanism, all the circuit components whose offsets are cancelled can be made physically very small to save silicon area because their matching is not a concern.

Bias circuit 302 further includes a programmable current source 364 to determine amplifier circuit bias input signals 366 for generating a determined bias current 368. Programmable current source 364 is responsive to bias calibration input signals 370 from comparator 316 when switch 320 is in the calibration phase (phase=1).

Programmable current source 364 includes a successive-approximation register (SAR) 372 (SAR1) and a digitally driven current source 378 (e.g., a 6-bit I-DAC1). During calibration phase (phase=1), output 318 of comparator 316 causes a count in SAR 372 (SAR1) to increase or decrease resulting in a count signal 374 for driving a digital-to-analog converter (DAC) in digitally driven current source 378 (I-DAC1). Bias circuit 302 further includes a bias transistor 376 for programmably generating a calibration bias current 380 as part of the bias determination process.

In operation, when phase control changes to the calibration phase (phase=1), the input to the switches 332, 334, 320, 342 causes toggling from the positions illustrated in FIG. 3. Output 318 of comparator 316 indicates if the transconductance (gm) is too large or too small, which is used by SAR 372 (SAR1) to find the next bit in digitally driven current source 378 (I-DAC1). Phase control then switches back to offset canceling phase (phase=0) and SAR 354 (SAR2) runs again to store and compensate for the offset which might be different under the new bias conditions. Because comparator 316 compares the current difference between the two phases, the offset of the replica circuit transistor is cancelled since the same transistors are used in the two phases.

Bias circuit 302 further includes a programmable current source 380 including a register 382 and a digitally driven current source 384 (e.g., a 6-bit I-DAC3). During the bias determination process, output 318 of comparator 316 causes a count in SAR 372 to increase or decrease a resulting count signal 374 for driving a digital-to-analog converter (DAC) in digitally driven current source 378. When the bias determination process completes, the resulting count signal 374 is stored in register 382 for providing amplifier circuit bias input signals 366 to digitally driven current source 384 (I-DAC3) resulting in generation of bias current 368.

Amplifier circuit 303 includes a bias transistor 386 for programmably generating a bias current 368 during an operational phase in response to a bias determination process. Amplifier circuit 303 further includes amplifier 314 for performing the desired function, for example, of low noise amplifiers (LNAs), mixers, synthesizers, resistance capacitance (RC) filters and transconductance capacitance (gm-C) filters.

In operation, when SAR 372 (SAR1) finishes, for example, finding all the 6-bits, the IDAC1 outputs a bias current that makes the replica exhibit the desired transconductance. The 6-bit digital input to the digitally driven current source 378 (I-DAC1) is then used to update register 382 which controls digitally driven current source 384 (I-DAC3) which is matched to digitally driven current source 378 (I-DAC1). The current output of digitally driven current source 384 (I-DAC3) is supplied to amplifier 314.

When the biasing calibration process is completed, various circuitry may be shut off, except digitally driven current source 384 (I-DAC3), to save power, whereas in conventional analog bias schemes, the bias circuit constantly draws current. Since calibration may finish, for example, in less than 50 usec when the bias circuit is clocked at 1 MHz, power consumption is greatly reduced. Furthermore, periodic re-execution of the biasing calibration method may be performed once every few seconds to track temperature variation resulting in yet a further reduction in power consumption.

Because of the digital feedback control (e.g., SAR), the biasing calibration process finds the correct bias current regardless of the I-V characteristic of amplifier transistors. Furthermore, because the calibration hardware (e.g., comparator, IDAC1, IDAC2, replica, SAR logic) is enabled, for example, only for 50 usec of every few seconds, the power consumption is very small. Accordingly, the constantly drawn current is the bias current itself generated by the digitally driven current source 384 (e.g., a 6-bit I-DAC3). Furthermore, accuracy is not dependent on transistor DC gain (e.g., loop gain in analog feedback) so it is scalable to future CMOS process without changing the design.

Additionally, because SAR 354 (SAR2) stores and cancels the offset, and because the gm measurement is done by measuring difference in time-domain using the same device (rather than between two different devices), the bias circuit does not require matching except for the generation of a 5 mV potential using a reference current and between digitally driven current source 378 (I-DAC1) and digitally driven current source 384 (I-DAC3). Furthermore, any error in the 5 mV potential can be made small by using large area resistors to match the resistor in the bandgap. The error in the reference current and mismatch between digitally driven current source 378 (I-DAC1) and digitally driven current source 384 (I-DAC3) can be made small by using a long channel transistor as a current source, all without increasing power consumption. Furthermore, since there is no need to maintain matching, except for very few circuit elements (e.g., a reference current source and a resistor used to generated dVgs) that define the target gm, resulting in a very small die area for the bias circuit as well as for the amplifier circuit.

Figure 4:
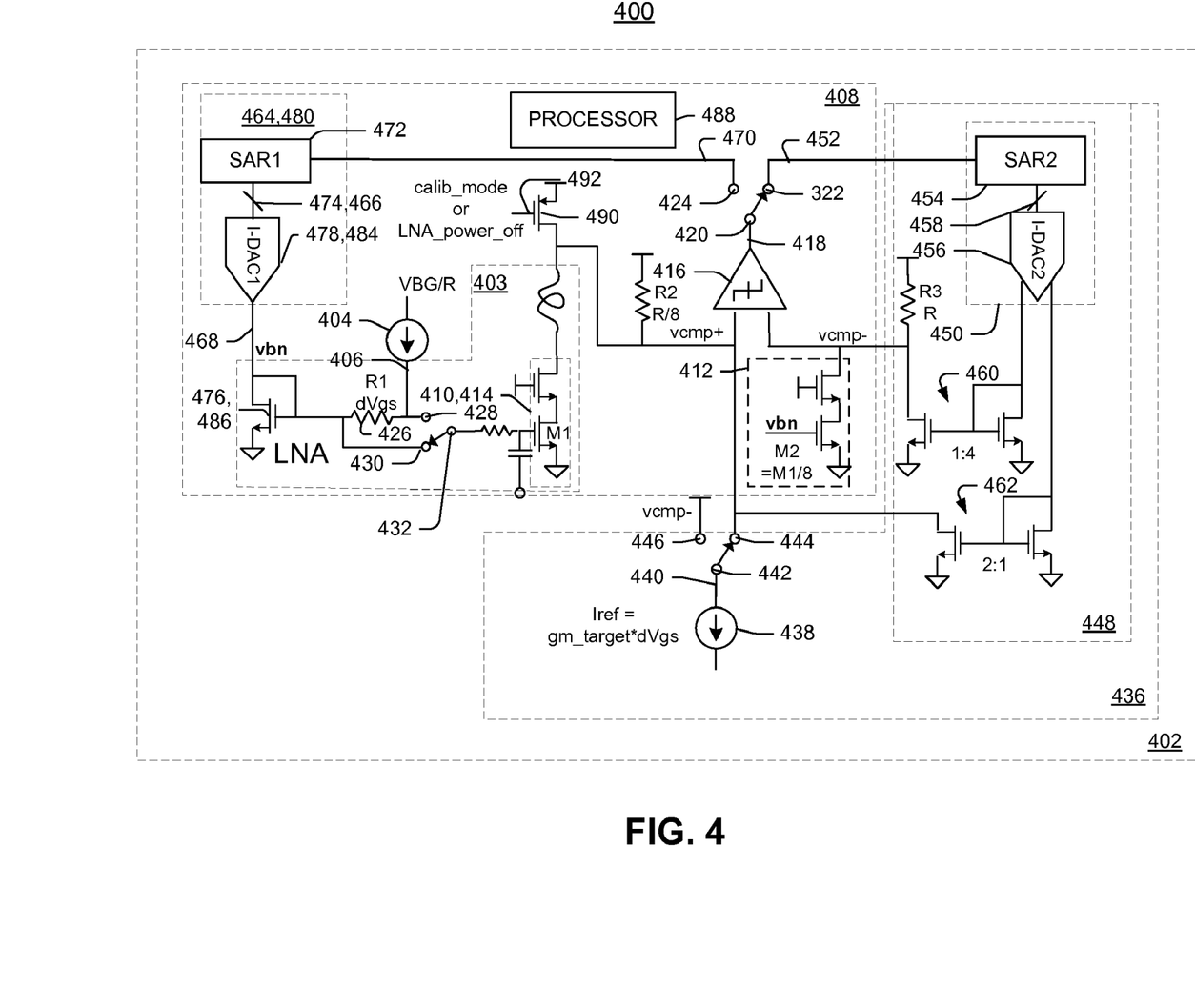
FIG. 4 illustrates a biased amplifier, in accordance with another exemplary embodiment.

FIG. 4 illustrates a biased amplifier, in accordance with another exemplary embodiment. A biased amplifier 400 includes a bias circuit 402 for configuring an amplifier circuit 403 into a biased configuration. The exemplary embodiment of FIG. 4 performs the transconductance (gm) calibration of the amplifier circuit 403 when the amplifier circuit 403 is in an off or inactive state. The exemplary embodiment of FIG. 4 uses the same amplifier 414 of amplifier circuit 403 as one of the "replica circuits" during the biasing calibration process. Accordingly, there can be no mismatch effect that limits the accuracy as in other biasing schemes, especially those for a pseudo-differential amplifier with no tail current.

Biasing circuit 402 of the present exemplary embodiment also does not rely on the square-law biasing model and hence allows transistors in deep submicron/nanometer CMOS technologies to maintain constant transconductance (gm) over process and temperature variations. Furthermore, biasing circuit 402 of the present exemplary embodiment consumes less power and produces less noise (i.e., thermal noise and flicker noise) than conventional bias circuits. Further advantages of the biasing circuit 402 include accuracy that does not rely on transistor gain (gm/gds) which degrades as CMOS processes are scaled down to finer resolution allowing the bias circuit 402 to be scaled to newer and future processes. Additionally, the bias circuit 402 does not require matching of all components of the biasing circuit resulting in fewer matched components and smaller silicon realization circuit area.

Bias circuit 402 generally includes a first reference current generator 404 to output a first reference current 406. First reference current generator 404 is configured as a constant current source and may be particularly configured as a bandgap reference generator. First reference current generator 404, by way of example and not limitation, is configured to source approximately 10 µA across the operational corners of the biased amplifier 400.

Bias circuit 402 further includes a bias determining circuit 408, including at least one replica circuit, configured according to the amplifier 414. In FIG. 4, the bias circuit 402 includes a first replica circuit 410 and a second replica circuit 412. In the present exemplary embodiment, first replica circuit 410 is the amplifier 414 and second replica circuit 412 replicates the arrangement of amplifier 414 of amplifier circuit 403 in processing and other variations. Each replica circuit consists of the same circuit used in amplifier 414 with first replica circuit 410 using amplifier 414 as the replica circuit and second replica circuit 412 being as nearly identically designed and processed as possible. Furthermore, placement of replica circuit 412 in close physical proximity to amplifier 414 (also functioning a first replica circuit 410 in the present exemplary embodiment) results in substantially shared processing and operational variations thereby allowing an improved bias determination for amplifier circuit 403 by bias circuit 402.

Bias circuit 402 further includes a comparator 416 having inputs respectively coupled to node vcmp+ and node vcmp−. Node vcmp+ is coupled to first replica circuit 410 and node vcmp− is coupled to second replica circuit 412. Comparator 416 further includes an output 418 which is coupled to a switch 420 switchable to an offset canceling phase position 422 and a calibration phase position 424 further described herein below.

Bias circuit 402 further includes an offset resistor 426 (R1) coupled to the first reference current generator 404 to create a difference in potential between a voltage potential at node 428 and node 430 on opposing ends of offset resistor 426 (R1) as the first reference current 406 passes therethrough. Bias circuit 402 further includes switch 432 for alternatingly connecting the potentials at nodes 428 and 430 to the driving inputs of first replica circuit 410 and second replica circuit 412 in response to selection of functional phases of an offset canceling phase (phase=0) and an calibration phase (phase=1) as selected by processor 488. The switch positions illustrated in FIG. 4 are the switch positions for the offset canceling phase (i.e., phase=0).

Bias circuit 402 further includes an offset canceling circuit 436 to cancel an offset induced by the first reference current 404. Offset canceling circuit 436 includes a second reference current generator 438 for outputting a second reference current 440 to cancel the offset induced by the first reference current 406. Second reference current generator 438 is configured as a constant current source and may be particularly configured as a bandgap reference generator. Second reference current generator 438, by way of example and not limitation, is configured to source a current $I_{const}$ equal to the target transconductance (gm_target) multiplied by the voltage drop (e.g., 5 mV) across offset resistor 426 (R1).

Offset canceling circuit 436 further includes switch 442 for alternatingly connecting the second reference current 440 of second current source 438 with the potentials at nodes 444 and 446 to the respective input nodes vcmp+ and vcmp− of comparator 416. The position of switch 442 is selectable in response to selection of functional phases of an offset canceling phase (phase=0) and a calibration phase (phase=1) as selected by processor 488. As stated, the switch positions illustrated in FIG. 4 are the switch positions for the offset canceling phase (i.e., phase=0).

Offset canceling circuit 436 further includes a programmable offset canceling circuit 448 to adjust an amount of the second reference current 440 that is used to cancel the offset induced by the first reference current 406. Programmable offset canceling circuit 448 includes a programmable current source 450 responsive to offset canceling input signals 452 from comparator 416 when switch 420 is in an offset canceling phase (phase=0).

Programmable current source 450 includes a successive-approximation register (SAR2) 454 (e.g., a 6-bit current DAC (IDAC)) and a digitally driven current source 456. During the offset canceling phase (phase=0), output 418 of comparator 416 causes a count in SAR 454 (SAR2) to increase or decrease a resulting count signal 458 for driving a digital-to-analog converter (DAC) in digitally driven current source 456. Programmable offset canceling circuit 448 further includes current mirrors 460, 462 for programmably sinking portions of the second reference current 440 as part of bias determination process.

In operation, digitally driven current source 456 (I-DAC2) is used to source a small amount of current to resistors R2 and R3 to add an offset. Digitally driven current source 456 (I-DAC2) is controlled by SAR 454 (SAR2), which is run in the calibration phase (phase=1) to store and compensate for the offset coming from the mismatch between the positive and negative resistors (R2, R3), the offset of the replica circuits 410, 412, the offset of the comparator 416 and the mismatch error of digitally driven current source 456 (I-DAC2). The SAR2 is run such that at the end of calibration phase (phase=1) the comparator input is very close to the trip-point of the comparator. Because of this digital offset cancellation mechanism, all the circuit components whose offset is cancelled can be made physically very small to save silicon area because their matching is not a concern.

Bias circuit 402 further includes a programmable current source 464 to determine amplifier circuit bias input signals 466 for generating a determined bias current 468. Programmable current source 464 is responsive to bias calibration input signals 470 from comparator 416 when switch 420 is in a calibration phase (phase=1).

Programmable current source 464 includes a successive-approximation register (SAR) 472 (SAR1) and a digitally driven current source 478 (e.g., a 6-bit I-DAC1). During calibration phase (phase=1), output 418 of comparator 416 causes a count in SAR 472 (SAR1) to increase or decrease resulting in a count signal 474 for driving a digital-to-analog converter (DAC) in digitally driven current source 478 (I-DAC1). Bias circuit 402 further includes a bias transistor 476 for programmably generating a calibration bias current 480 as part of bias determination process.

In operation, when phase control changes to the calibration phase (phase=1), the input to the switches 432, 420, 442 causes toggling from the positions illustrated in FIG. 4. Output 418 of comparator 416 indicates if the transconductance (gm) is too large or too small, which is used by SAR 472 (SAR1) to find the next bit in digitally driven current source 478 (I-DAC1). Phase control then switches back to offset canceling phase (phase=0) and SAR 454 (SAR2) runs again to store and compensate for the offset which might be different under the new bias conditions. Because comparator 416 compares the current difference between the two phases, the offset of the replica circuit transistor is cancelled since the same transistors are used in the two phases.

In the exemplary embodiment of FIG. 3, bias circuit 302 further included a programmable current source 380 including a register 382 and a digitally driven current source 384 (e.g., a 6-bit I-DAC3). However, the present exemplary embodiment of FIG. 4 reuses the programmable current source 464 as the programmable source 480 during operational mode of the biased amplifier 400. Accordingly, once the bias determination process is completed, programmable current source 480 is properly biased when programmable current source 480 completes the bias determination process. Accordingly, when the bias determination process completes, the resulting count signal 474 is already stored in SAR 472 (SAR1) for providing the count signal 474 serving as the amplifier circuit bias input signals 466 to digitally driven current source 484 (I-DAC1), resulting in generation of bias current 468.

Amplifier circuit 403 includes a bias transistor 476 for programmably generating a bias current 468 during an operational phase in response to a bias determination process. Amplifier circuit 403 further includes amplifier 414 for performing the desired function, for example, of low noise amplifiers (LNAs), mixers, synthesizers, resistance capacitance (RC) filters and transconductance capacitance (gm-C) filters.

In operation, when SAR 472 (SAR1) finishes, for example, finding all the 6-bits, the IDAC1 outputs a bias current that makes the replica exhibit the desired transconductance. A switch 490 is activated by a calibration_mode (LNA_power_off) signal 492 from processor 488 to pull-up the first replica circuit 410 to then operate as the amplifier 414 of the amplifier circuit 403. The 6-bit digital input to the digitally driven current source 478 (I-DAC1) is then used to control digitally driven current source 484 (I-DAC1) which is the same digitally driven current source 478 used in the bias circuit 402 to identify the bias current.

When the biasing determination process is completed, various circuitry may be shut off, except digitally driven current source 484 (I-DAC1), to save power, whereas in conventional analog bias schemes, the bias circuit constantly draws current. Since calibration may finish, for example, in less than 50 usec when the bias circuit is clocked at 1 MHz, power consumption is greatly reduced. Furthermore, periodic re-execution of the biasing calibration method may be performed once every few seconds to track temperature variation resulting in a yet further reduction in power consumption.

Because of the digital feedback control (e.g., SAR), the biasing calibration process finds the correct bias current regardless of the I-V characteristic of amplifier transistors. Furthermore, because the calibration hardware (e.g., comparator, IDAC1, IDAC2, replica, SAR logic) is enabled, for example, only for 50 usec of every few seconds, the power consumption is very small. Accordingly, the constantly drawn current is the bias current itself generated by the digitally driven current source 484 (e.g., a 6-bit I-DAC1). Furthermore, the accuracy is not dependent on transistor DC gain (e.g., loop gain in analog feedback) so it is scalable to future CMOS process without changing the design.

Additionally, because SAR 454 (SAR2) stores and cancels the offset, and because the gm measurement is done by measuring difference in time-domain using the same device (rather than between two different devices), the bias circuit does not require matching except for the generation of a 5 mV potential using a reference current and between digitally driven current source 478 (I-DAC1) also functioning as digitally driven current source 484 (I-DAC1). Furthermore, any error in the 5 mV potential can be made small by using large area resistors to match the resistor in the bandgap as stated above.

In the present exemplary embodiment, there is no error in the reference current and mismatch between digitally driven current source 478 (I-DAC1) and digitally driven current source 484 (I-DAC1) (as occurred in the exemplary embodiment of FIG. 3) as they are implemented as one and the same device. Furthermore, since there is no need to maintain matching, except for very few circuit elements (e.g., a reference current source and a resistor used to generated dVgs) that define the target gm, resulting in a very small die area for the bias circuit as well as the amplifier circuit.

Figure 5:
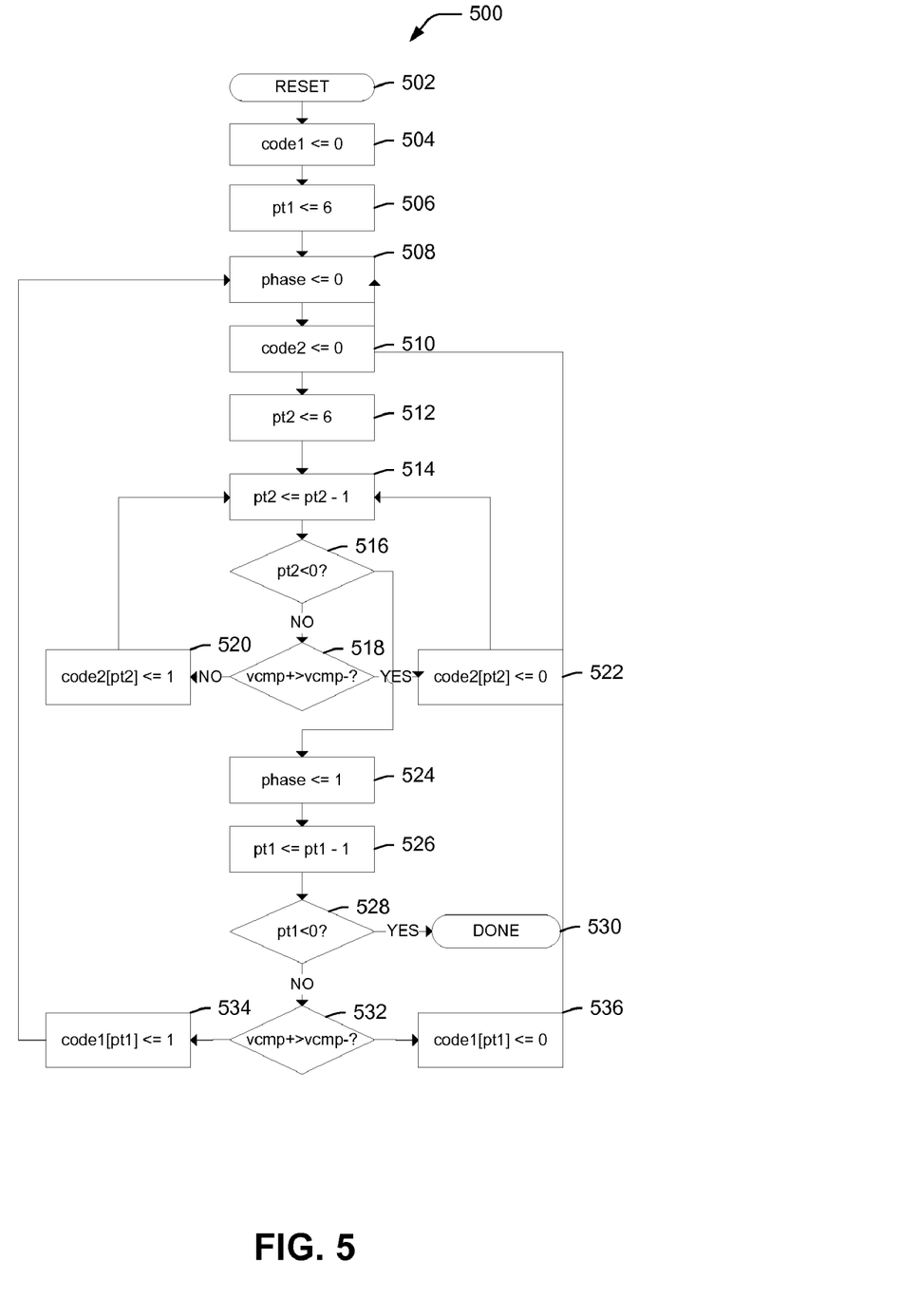
FIG. 5 is a flowchart of a bias determination process, in accordance with an exemplary embodiment.

FIG. 5 is a flowchart of a bias determination process, in accordance with an exemplary embodiment. A bias determination process 500 may be carried out in various execution devices, state machines or processors executing processor-executable instructions. By way of example, bias determination process 500 may occur in processors 388, 488 of the exemplary respective embodiments of FIG. 3 and FIG. 4.

In process 500, a reset step 502 resets any residual values in the various successive-approximation registers (SARs). The SARs may reset to an initialization value or a zero value as known by those of ordinary skill in the art. In a step 504, a counter value ("code1") in SAR1 (372, 472) is assigned an initial count value of "0". In a step 506, an SAR1 pointer ("pt1") is assigned an iteration value, for example, of "6". In a step 508, a phase identifier ("phase") is assigned the value of "0" signifying the offset canceling phase (i.e., phase=0) described above. The offset canceling phase is implemented as an "outer loop" involving steps 508-536. In a step 510, a counter value ("code2") in SAR2 (354, 454) is assigned an initial count value of "0". In a step 512, an SAR2 pointer ("pt2") is assigned an iteration value, for example, of "6". In a step 514, the SAR2 pointer ("pt2") is decremented to "pt2−1".

In a query step 516, the SAR2 pointer ("pt2") is compared to determine if the iterations are complete. If the iterations are not complete, then the SAR2 (354, 454) is updated according to a query step 518. In query step 518, the comparator (316, 416) function occurs and the count ("code2[pt2]") in SAR2 is either given the value of "1" in step 520 or given the value of "0" in step 522. The steps 514-522, forming an "inner loop," continue until query step 516 determines "inner loop" iterations are complete.

When the "inner loop" iterations of SAR2 are complete, a step 524 changes the operation to the calibration phase (phase=1). In a step 526, the SAR1 pointer ("pt1") is decremented to "pt1−1". In a query step 528, the SAR1 pointer ("pt1") is compared to determine if the iterations are complete. If the iterations are not complete, then the SAR1 (372, 472) is updated according to a query step 532. In query step 532, the comparator (316, 416) function occurs and the count ("code1[pt1]") in SAR1 is either given the value of "1" in step 534 or given the value of "0" in step 536. Processing then returns to step 508 where the phase identifier ("phase") is assigned the value of "0" signifying the offset canceling phase (i.e., phase=0) described above.

Processing repeats as describe above until query step 528 determines that the SAR1 pointer ("pt1") indicates the iterations are complete. Processing then passes to a step 530. For the exemplary embodiment of FIG. 3, step 530 may further include transferring resulting count signal 374 from SAR1 372 into register 382 for storing and for providing amplifier circuit bias input signals 366 to digitally driven current source 384 (I-DAC3) resulting in generation of bias current 368. For the exemplary embodiment of FIG. 4, step 530 may further include activating signal 492 to control switch 490 to deactivate the calibration_mode (LNA_power_off) and to pull-up the first replica circuit 410 to then operate as the amplifier 414 of the amplifier circuit 403.

Figure 6:
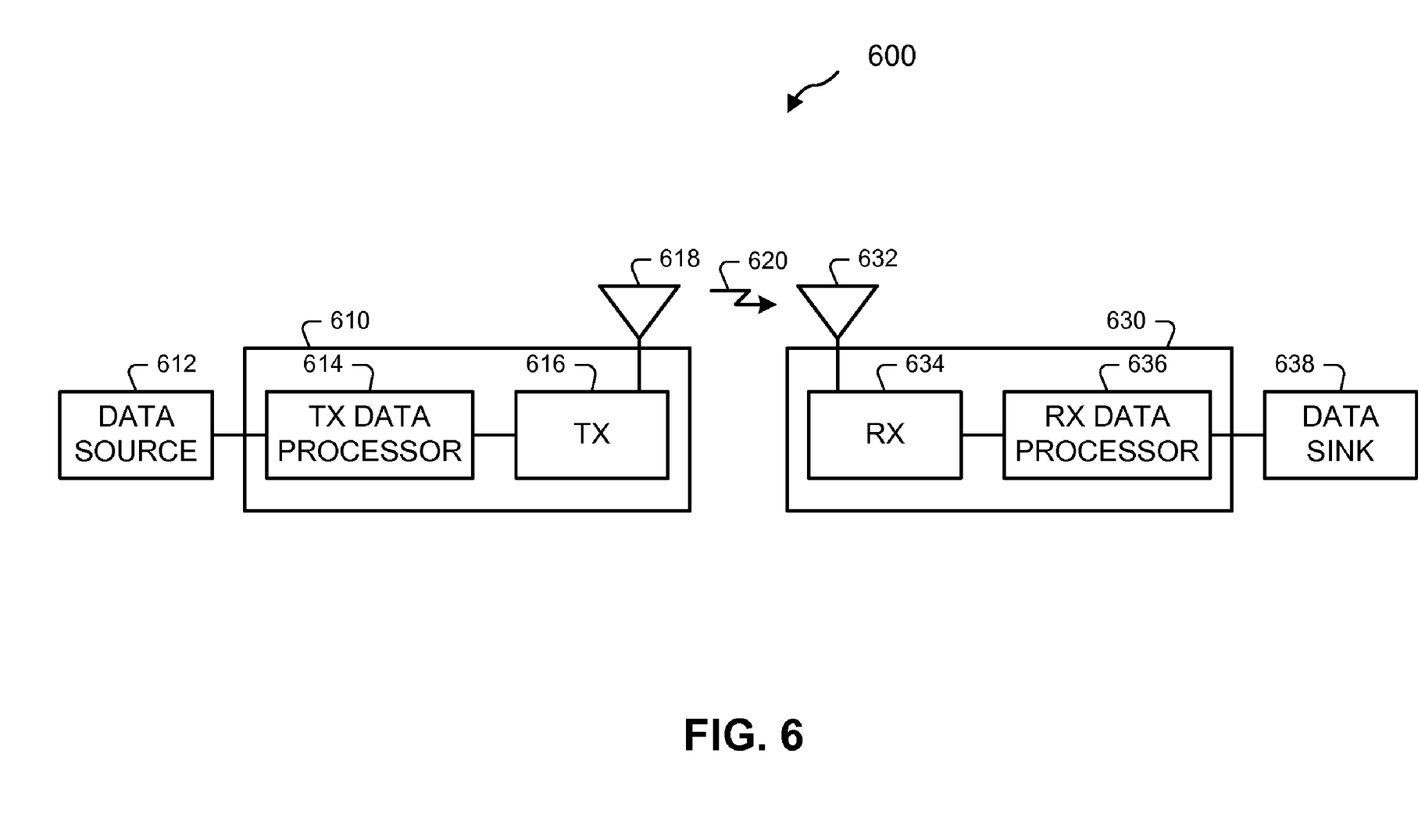
FIG. 6 is a simplified block diagram of a transmitter and receiver, in accordance with an exemplary embodiment of a transmitter and receiver communications system.

FIG. 6 is a simplified block diagram of an exemplary embodiment of a communications system 600. At a transmitter unit 610, data is sent, typically in packets, from a data source 612 to a transmitter data processor 614 that formats, encodes, and processes the data to generate one or more analog signals. The analog signals are then provided to a transmitter 616 that amplifies, filters, quadrature modulates, and upconverts the analog signals to generate a modulated signal suitable for transmission over a communications channel 620 via an antenna 618.

At a receiver unit 630, the transmitted signal is received by an antenna 632 and provided to a receiver 634. Within the receiver 634, the signal is amplified, filtered, frequency downconverted, quadrature demodulated, and digitized to provide inphase (I) and quadrature (Q) samples. The amplification and filtering of the signals may utilize one or more biased amplifiers 300, 400 including a bias circuit 302, 402 for configuring an amplifier circuit 303, 403 as described above. The samples may be digitally processed and then provided to, for example, a receiver data processor 636 that further processes and decodes the samples to recover the transmitted data. The processing and decoding at the receiver data processor 636 are performed in a manner complementary to the processing and encoding performed at transmitter data processor 614. The decoded data is then provided to a data sink 638.

Figure 7:
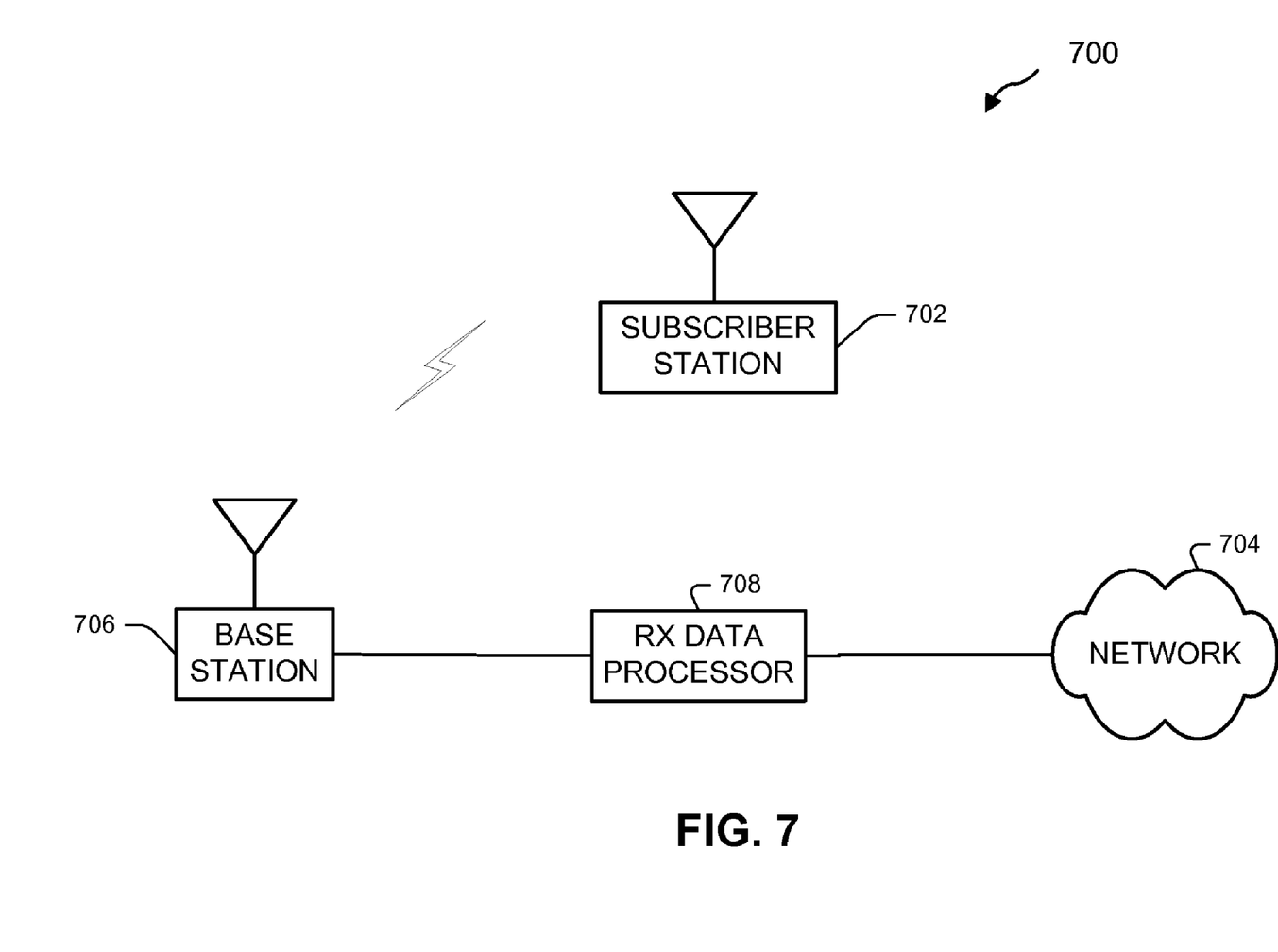
FIG. 7 is a simplified block diagram of a communication system, in accordance with an exemplary embodiment.

FIG. 7 is a simplified block diagram of a communication system in accordance with an exemplary embodiment. It is noted that the generality of exemplary bias amplifier 300, 400 can be extended to any receiver that requires linear transconductance over PVT corners. By way of example, the exemplary biased amplifier can be applied to receivers supporting mobile radio systems. One such mobile radio system is a code division multiple access (CDMA) communications system. The CDMA communications system is a modulation and multiple access scheme based on spread-spectrum communications.

In a CDMA communications system, a large number of signals share the same frequency spectrum and, as a result, provide an increase in user capacity. This is achieved by transmitting each signal with a different pseudo-random binary sequence that modulates a carrier, and thereby, spreads the spectrum of the signal waveform. The transmitted signals are separated in the receiver by a correlator that uses a corresponding pseudo-random binary sequence to despread the desired signal's spectrum. The undesired signals, whose pseudo-random binary sequence do not match, are not despread in bandwidth and contribute only to noise.

For CDMA communications systems designed to transmit at higher data rates, such as a High Data Rate (HDR) communications system, amplifiers in low noise amplifiers (LNAs), mixers, synthesizers, resistance capacitance (RC) filters and transconductance capacitance (gm-C) filters that are biased according to the bias determination process described herein may be used to process received signals while maintaining consistent operational characteristics over variations in fabrication processes and operational temperature conditions. The HDR communications system is typically designed to conform to one or more standards such as the "cdma2000 High Rate Packet Data Air Interface Specification," 3GPP2 C.S0024, Version 2, Oct. 27, 2000, promulgated by a consortium called "3$^{rd}$ Generation Partnership Project." The contents of the aforementioned standard is incorporated by reference herein.

An exemplary HDR communications system employing the bias determination process described herein is shown in FIG. 7. The exemplary HDR communications system 700 includes a subscriber station 702 in communication with a data network 704 by transmitting data on a reverse link to a base station 706. The base station 706 receives the data and routes the data through a base station controller (BSC) 708 to the network 704. Conversely, communications to the subscriber station 702 can be routed from the network 704 to the base station 706 via the BSC 708 and transmitted from the base station 706 to the subscriber station 702 on a forward link. The forward link refers to the transmission from the base station to the subscriber station and the reverse link refers to the transmission from the subscriber station to the base station.

The communications system shown in FIG. 7 depicts a single base station 706 in communication with a single subscriber station 702 for ease of explanation. As those skilled in the art will appreciate, the forward link transmission can occur between the base station and one or more subscriber stations. Similarly, the reverse link transmission can occur between one subscriber station and one or more base stations.

In the exemplary HDR communications system, the forward link data transmission from the base station 706 to the subscriber station 702 may occur at or near the maximum data rate which can be supported by the forward link. Initially, the subscriber station 702 establishes communication with the base station 706 using a predetermined access procedure. In this connected state, the subscriber station 702 can receive data and control messages from the base station 706, and is able to transmit data and control messages to the base station 706. The subscriber station 702 biases amplifier circuit 303, 403 (FIGS. 3-5) in receiver 634 (FIG. 6) accordingly to bias circuits 302, 402 (FIGS. 3-5) as described above. Furthermore, base station 706 may similarly include receivers 634 that include biased amplifiers 300, 400 (FIGS. 3-5).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, (e.g., a combination of a DSP and a microprocessor, a plurality of microprocessors, one or more microprocessors in conjunction with a DSP core, or any other such configuration).

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

Therefore, the present invention is not to be limited except in accordance with the following claims.

What is claimed is:

1. A bias circuit, comprising:
    a first reference current generator to output a first reference current;
    a bias determining circuit including at least one replica circuit configured according to an amplifier circuit, the bias circuit for biasing the amplifier circuit according to a determined bias current, the bias determining circuit further configured to cancel an offset induced by the first reference current and to generate amplifier circuit bias input signals in response to canceling the offset; and
    an amplifier circuit programmable current source responsive to the amplifier circuit bias input signals for generating the determined bias current.

2. The bias circuit of claim 1, wherein the bias determining circuit further comprises a comparator configured to identify when the offset induced by the first reference current is canceled.

3. The bias circuit of claim 2, wherein the at least one replica comprises a first replica circuit and a second replica circuit of the amplifier circuit and each coupled to respective first and second inputs of the comparator.

4. The bias circuit of claim 3, wherein the offset induced by the first reference circuit is alternatingly coupled to each of the first and second replica circuits.

5. The bias circuit of claim 2, wherein the at least one replica comprises a first replica circuit of the amplifier circuit and a second replica, the second replica being the amplifier circuit, the first and second replicas each coupled to respective first and second inputs of the comparator.

6. The bias circuit of claim 5, further comprising a calibration switch to couple the amplifier circuit into and out of the bias determining circuit.

7. The bias circuit of claim 1, wherein the bias determining circuit further comprises an offset canceling circuit including a second reference current generator to output a second reference current to cancel the offset induced by the first reference current.

8. The bias circuit of claim 7, wherein the offset canceling circuit is further configured to adjust an amount of the second reference current that is used to cancel the offset induced by the first reference current, the offset canceling circuit further including a second digitally driven current source responsive to second digital indicators generated by the bias determining circuit.

9. An amplifier, comprising:
    a bias circuit, including:
        a first reference current generator to output a first reference current;
        a bias determining circuit including at least one replica circuit configured according to an amplifier circuit, the bias circuit for biasing the amplifier circuit according to a determined bias current, the bias determining circuit further configured to cancel an offset induced by the first reference current and to generate amplifier circuit bias input signals in response to canceling the offset; and
        an amplifier circuit programmable current source responsive to the amplifier circuit bias input signals for generating the determined bias current; and
    an amplifier circuit coupled to the bias circuit and biased according to the determined bias current.

10. The amplifier of claim 9, wherein the bias determining circuit further comprises a comparator configured to identify when the offset induced by the first reference current is canceled.

11. The amplifier of claim 10, wherein the at least one replica comprises a first replica circuit and a second replica circuit of the amplifier circuit and each coupled to respective first and second inputs of the comparator.

12. The amplifier of claim 11, wherein the offset induced by the first reference circuit is alternatingly coupled to each of the first and second replica circuits.

13. The amplifier of claim 10, wherein the at least one replica comprises a first replica circuit of the amplifier circuit and a second replica, the second replica being the amplifier circuit, the first and second replicas each coupled to respective first and second inputs of the comparator.

14. A receiver including at lease one of an amplifier and filter, the at least one of the amplifier or filter including a bias circuit, comprising:
   a first reference current generator to output a first reference current;
   a bias determining circuit including at least one replica circuit configured according to an amplifier circuit, the bias circuit for biasing the amplifier circuit according to a determined bias current, the bias determining circuit further configured to cancel an offset induced by the first reference current and to generate amplifier circuit bias input signals in response to canceling the offset; and
   an amplifier circuit programmable current source responsive to the amplifier circuit bias input signals for generating the determined bias current.

15. The receiver of claim 14, wherein the bias determining circuit further comprises a comparator configured to identify when the offset induced by the first reference current is canceled.

16. The receiver of claim 15, wherein the at least one replica comprises a first replica circuit and a second replica circuit of the amplifier circuit and each coupled to respective first and second inputs of the comparator.

17. The receiver of claim 14, wherein the bias determining circuit further comprises an offset canceling circuit including a second reference current generator to output a second reference current to cancel the offset induced by the first reference current.

18. A method of biasing an amplifier, comprising:
   outputting a first reference current from a first reference current generator;
   first comparing a first output voltage of a first replica circuit with a second output voltage of a second replica circuit during an offset canceling phase, wherein the first and second replica circuits are configured according to an amplifier circuit including the amplifier, and wherein the first and second replica circuits are differently driven by an offset induced by the first reference current;
   adjusting an offset canceling circuit to adjust canceling the offset induced by the first reference current in response to a result of the first comparing step;
   secondly comparing the second output voltage of the second replica circuit with the first output voltage of the first replica circuit during a calibration phase;
   adjusting a calibration bias current to adjust driving the first and second replica circuits in response to a result of the second comparing step; and
   determining biasing of the amplifier based on the calibration bias current.

19. The method of claim 18, wherein the adjusting an offset canceling circuit step repeats until the offset induced by the first reference current is canceled.

20. The method of claim 18, wherein one of the first and second replica circuits is the amplifier to be biased.

21. The method of claim 20, further comprising switching the amplifier into a bias determining circuit for determining the biasing of the amplifier.

22. The method of claim 18, wherein the adjusting an offset canceling circuit further comprises outputting a second reference current to assist in adjust canceling the offset induced by the first reference current.

23. The method of claim 18, wherein the adjusting a calibration bias current step repeats until the calibration bias current stabilizes.

24. An amplifier, comprising:
   means for outputting a first reference current from a first reference current generator;
   means for first comparing a first output voltage of a first replica circuit with a second output voltage of a second replica circuit during an offset canceling phase, wherein the first and second replica circuits are configured according to an amplifier circuit including the amplifier, and wherein the first and second replica circuits are differently driven by an offset induced by the first reference current;
   means for adjusting an offset canceling circuit to adjust canceling the offset induced by the first reference current in response to a result of the first comparing step;
   means for secondly comparing the second output voltage of the second replica circuit with the first output voltage of the first replica circuit during a calibration phase;
   means for adjusting a calibration bias current to adjust driving the first and second replica circuits in response to a result of the second comparing step; and
   means for determining biasing of the amplifier based on the calibration bias current.

25. A non-transitory processor-readable media embodying a program of instructions executable by a processor to perform a method of biasing an amplifier, the method comprising:
   first configuring a first output voltage of a first replica circuit with a second output voltage of a second replica circuit for first comparing during an offset canceling phase, wherein the first and second replica circuits are configured according to an amplifier circuit including the amplifier, and wherein the first and second replica circuits are differently driven by an offset induced by the first reference current;
   adjusting an offset canceling circuit to adjust canceling the offset induced by the first reference current in response to a result of the first comparing;
   secondly configuring the second output voltage of the second replica circuit with the first output voltage of the first replica circuit for secondly comparing during a calibration phase;
   adjusting a calibration bias current to adjust driving the first and second replica circuits in response to a result of the second comparing; and
   determining biasing of the amplifier based on the calibration bias current.

* * * * *